United States Patent
Wenske

(10) Patent No.: US 6,911,866 B2
(45) Date of Patent: Jun. 28, 2005

(54) METHOD AND DEVICE FOR SWITCH-ON CURRENT LIMITING IN PUSH-PULL AMPLIFYING POWER STAGES

(75) Inventor: Holger Wenske, Freising (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/480,629

(22) PCT Filed: Jun. 7, 2002

(86) PCT No.: PCT/EP02/06285
§ 371 (c)(1),
(2), (4) Date: Dec. 12, 2003

(87) PCT Pub. No.: WO03/005572
PCT Pub. Date: Jan. 16, 2003

(65) Prior Publication Data
US 2004/0174217 A1 Sep. 9, 2004

(30) Foreign Application Priority Data
Jun. 13, 2001 (DE) ........................ 101 28 772

(51) Int. Cl.[7] ............................... H03F 3/18
(52) U.S. Cl. ................... 330/264; 330/269; 330/277; 330/288
(58) Field of Search ................ 330/264, 269, 330/277, 288; 327/329, 548

(56) References Cited

U.S. PATENT DOCUMENTS

| 4,225,897 A | 9/1980 | Kaplan ..................... 361/87 |
| 4,330,757 A | 5/1982 | Fukaya et al. ............... 330/298 |
| 4,857,861 A | 8/1989 | Seevinck et al. ............ 330/255 |
| 4,912,425 A * | 3/1990 | Kobayashi et al. .......... 330/264 |
| 5,008,586 A | 4/1991 | Miyazaki et al. ............ 323/315 |
| 6,154,094 A | 11/2000 | Seven ......................... 330/252 |
| 6,323,703 B1 * | 11/2001 | Fotouhi ....................... 327/112 |
| 6,624,671 B2 * | 9/2003 | Fotouhi ....................... 327/112 |

FOREIGN PATENT DOCUMENTS

| DE | 4329865 | 12/1995 |
| EP | 0427557 | 11/1990 |
| EP | 0479704 | 9/1991 |
| EP | 0772273 | 10/1995 |

* cited by examiner

Primary Examiner—Khanh V. Nguyen
(74) Attorney, Agent, or Firm—Maginot, Moore & Beck

(57) ABSTRACT

The invention provides a method for amplification of analog push-pull signals (101a, 101b) by means of a push-pull amplifier output stage (100) which has a first output stage transistor (102a) and a second output stage transistor (102b), with first and second analog push-pull signals (101a, 101b) being applied to the first and second output stage transistors (102a, 102b) and to first and second control transistors (103a, 103b), by which means first and second control currents (104a, 104b) are controlled, furthermore with the second control current (104b) which is controlled by the second control transistor (103b) being mirrored by means of a current mirror device (105) into a mirrored second control current (104c), with the first control current (104a) being compared with a first reference current, with the mirrored second control current (104c) being compared with a second reference current, with reference voltage levels (107a, 107b) which are produced by the comparison processes being logically linked in an AND gate (110), and with a fault signal (111) which is produced by the AND gate (110) being used to drive a limiter transistor (112) in order to limit any inrush current flow through the output stage transistors (102a, 102b).

30 Claims, 2 Drawing Sheets

METHOD AND DEVICE FOR SWITCH-ON CURRENT LIMITING IN PUSH-PULL AMPLIFYING POWER STAGES

This application claims priority under 35 U.S.C. § 119 to PCT Application No. PCT/EP02/06285 filed on Jun. 7, 2002 which claimed priority to German Application No. 10128772.0 filed on Jun. 13, 2001.

The present invention relates to a method for amplification of analog push-pull signals by means of a push-pull amplifier output stage, and relates in particular to a method for inrush current limiting in push-pull output stages.

In wire-based transmission systems such as ISDN and xDSL, line drivers are used in order to feed analog signals with the required transmission power to a cable. The analog signals are frequently in the form of analog push-pull signals, with the operational power amplifiers which are used having a power output stage in order to provide the necessary output currents. In general, for technological reasons, low supply voltages are used for a push-pull amplifier stage which is intended to amplify analog push-pull signals, so that an output stage must be provided with appropriately greater output currents for a constant output power level.

Figure 2:
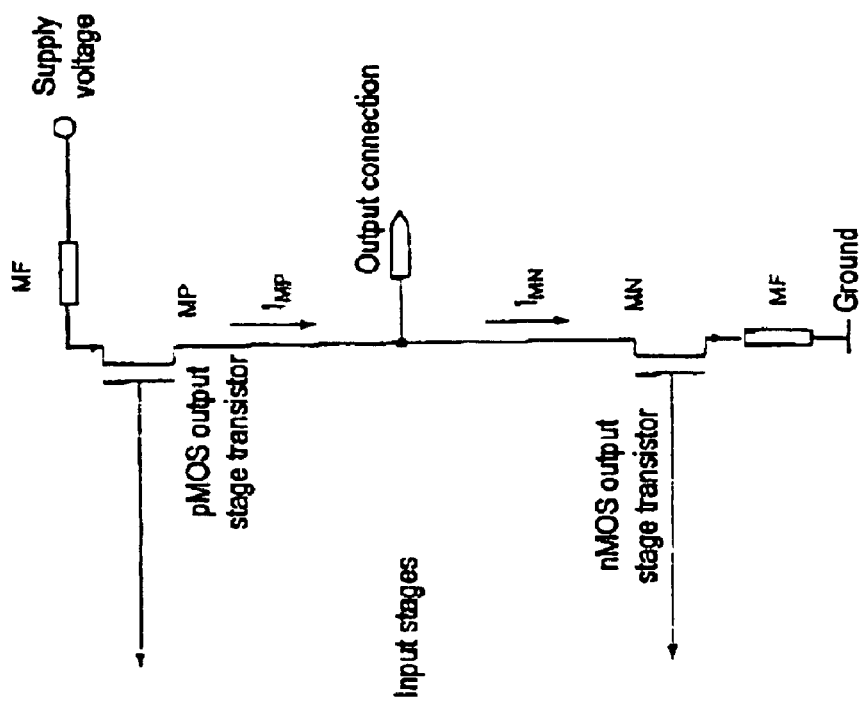

FIG. 2 shows an outline circuit arrangement of a conventional push-pull amplifier output stage which is formed from two output stage transistors. The complementary output stage transistors in the example shown in FIG. 2 are a p-channel (pMOS) output stage transistor and an n-channel (nMOS) output stage transistor (MOS=metal oxide silicon). For reasons of clarity, the electronic circuits of the input stage devices and of the amplifier output stages (output connection) have been omitted in FIG. 2, in order to illustrate the fundamental disadvantages and problems of conventional push-pull amplifier output stages.

The input stage devices (arrows in FIG. 2) drive the gate connections of the two output stage transistors. A supply voltage is applied via a measurement sensor MF to the source connection of the pMOS output stage transistor, while the source connection of the nMOS output stage transistor MN is connected to ground via a second measurement sensor MF. In a corresponding manner to the gate connections in the push-pull amplifier output stage being driven correctly, the currents $I_{MP}$ and $I_{MN}$ flow alternately to the output connection. The currents $I_{MP}$ and $I_{MN}$ are increased in a corresponding manner owing to the supply voltage which, as mentioned, is kept low for technological reasons.

During normal amplified operation, the push-pull amplifier output stage alternately supplies currents to the load and draws currents from the load. At the moment when the circuit arrangement is switched on, the electrical relationships are undefined. Until a predetermined operating point is set, the circuit may assume different states which are dependent on internal and external factors. One particular disadvantage of conventional circuit arrangements is that both output stage transistors may be switched on simultaneously at the moment of switching on, as a result of which very large inrush currents occur. The high inrush currents may disadvantageously exceed the current carrying capacity of the transistors or, very high inrush currents may lead to destruction of electronic components in the push-pull amplifier output stage.

A further disadvantage is that electronic components of a device for providing the supply voltage and the supply current can also be destroyed by an excessively high inrush current. Electromigration may disadvantageously occur, and this considerably reduces the life of electronic components.

As is shown in FIG. 2, the drain connections of the two output stage transistors are connected to one another and to an output connection. In order to ensure that excessively high inrush currents are detected, the conventional circuit arrangement has two measurement sensors MF which may be in the form of non-reactive resistors. Detection of a voltage drop which occurs across the measurement sensors MF and is caused by the currents $I_{MP}$ and $I_{MN}$ makes it possible to use controlled electronics (not shown) to switch off the push-pull amplifier output stage (or some other suitable measure if the inrush currents are excessive).

One disadvantage of the use of measurement sensors MF for current monitoring is that considerable power levels can be produced in the measurement sensors as well when the current levels are high, reducing the efficiency of the push-pull amplifier output stage.

In conventional circuit arrangements, the control voltages for the output stage transistors are often limited to a maximum value, which disadvantageously means that the maximum output current during normal operation is also limited.

One object of the present invention is thus to provide a method for amplification of analog push-pull signals by means of a push-pull amplifier output stage, in which any inrush current is safely limited. This ensures that only one of the two output stage transistors is in each case switched on.

According to the invention, this object is achieved by the method as specified in patent claim 1 and by a circuit arrangement having the features of claim 20.

Further refinements of the invention can be found in the dependent claims.

One major idea of the invention is to provide a fault signal when the two output stage transistors are switched on at the same time, with this fault signal being fed back to a limiter transistor so as to limit any inrush current.

One advantage of the present invention is that there is no need for any resistive measurement sensors formed by non-reactive resistors, which reduce the efficiency of the push-pull amplifier output stage.

A further advantage of the circuit arrangement according to the present invention is that very low supply voltages and, associated with them, very high currents, can be used in the push-pull amplifier output stage since the invention prevents the two output stage transistors from being switched on at the same time.

The method according to the invention for amplification of analog push-pull signals by means of a push-pull amplifier output stage which has a first output stage transistor and a second output stage transistor essentially comprises the following steps:

a) application of a first analog push-pull signal to the first output stage transistor and to a first control transistor by means of which a first control current is controlled;

b) application of a second analog push-pull signal to the second output stage transistor and to a second control transistor by means of which a second control current is controlled;

c) comparison of the first control current with a first reference current which is produced by a first reference current device;

d) comparison of the second control current with a second reference current which is produced by a second reference current device;

e) outputting of a fault signal as a function of the comparison, when not only is the first reference current exceeded by the first control current but the second reference current is also exceeded by the second control current;

f) feeding back the fault signal such that an inrush current is limited by limiting at least one control voltage of at least one output stage transistor; and g) outputting of the amplified analog push-pull signal as output currents via an output connection.

The dependent claims contain advantageous developments and improvements of the respective subject matter of the invention.

According to one preferred development of the present invention, the first analog push-pull signal is input in complementary form to the second analog push-pull signal.

According to a further preferred development of the present invention, the second control current is mirrored by means of a current mirror device into a mirrored second control current.

According to yet another further preferred development of the present invention, the first control current is mirrored, rather than the second control current, in the current mirror device.

According to yet another further preferred development of the present invention, the fault signal which is output from an output connection of the AND gate is used for diagnosis and test purposes in which it is supplied to a fault output connection.

According to yet another further preferred development of the present invention, the ratio of the first control current to the mirrored second control current corresponds to the ratio of the first output current to the second output current.

According to yet another further preferred development of the present invention, the ratio of the first control current to the first output current, and the ratio of the mirrored second control current to the second output current are selected such that the energy consumption caused by the two control currents is negligible and the efficiency of the push-pull amplifier output stage is not reduced, so that the fault signal is provided with negligible energy consumption.

According to yet another further preferred development of the present invention, the fault signal which is supplied to the gate connection of the limiter transistor is used to limit a control voltage for the second output stage transistor.

According to yet another further preferred development of the present invention, the fault signal which is supplied to the gate connection of the limiter transistor is used to limit a control voltage for the first output stage transistor.

According to yet another further preferred development of the present invention, the fault signal, which is output from an output connection of the AND gate is supplied to an external processor thus making it possible to process the fault signal further, for example for test and analysis purposes.

According to yet another further preferred development of the present invention, a parallel current via the push-pull amplifier output stage during switching on is prevented, that is to say this prevents both output stage transistors from being switched on during switch-on.

According to yet another further preferred development of the present invention, digital circuit elements and logic circuit devices, such as the AND gate, and analog circuit elements are combined.

According to yet another further preferred development of the present invention, a first reference voltage level at a first reference voltage connection changes from a low level (logic L level) to a high level (logic H level) when the first control current is greater than the first reference current.

According to yet another further preferred development of the present invention, a second reference voltage level at a second reference voltage connection changes from a low level (logic L level) to a high level (logic H level) when the second control current is greater than the second reference current.

According to yet another further preferred development of the present invention, the first reference voltage level and the second reference voltage level are linked in a logic circuit unit in order to produce a fault signal with the logic circuit unit outputting a fault signal when both the first reference voltage level and the second reference voltage level are at a high level (logic H level) at the same time.

According to yet another further preferred development of the present invention, a gate connection of the limiter transistor has the fault signal applied to it, order to limit the inrush current through at least one output stage transistor.

According to yet another further preferred development of the present invention, the fault signal is fed back to electronic circuits of input stage devices such that any inrush current is limited in that at least one control voltage of at least one output stage transistor is limited.

The circuit arrangement according to the invention for amplification of analog push-pull signals also has:

a) a first output stage transistor;
b) a second output stage transistor;
c) a first control transistor which is used to control a first control current;
d) a second control transistor which is used to control a second control current;
e) a first reference current device for producing a first reference current which is compared with the first control current;
f) a second reference current device for producing a second reference current which is compared with the second control current;
g) a limiter device for driving the at least one output stage transistor such that any inrush current is limited as a function of a comparison of the control current with the respective reference currents; and
h) an output connection for outputting the amplified analog push-pull signals as output currents as a function of limiting by the limiter device.

DRAWINGS

Figure 1:
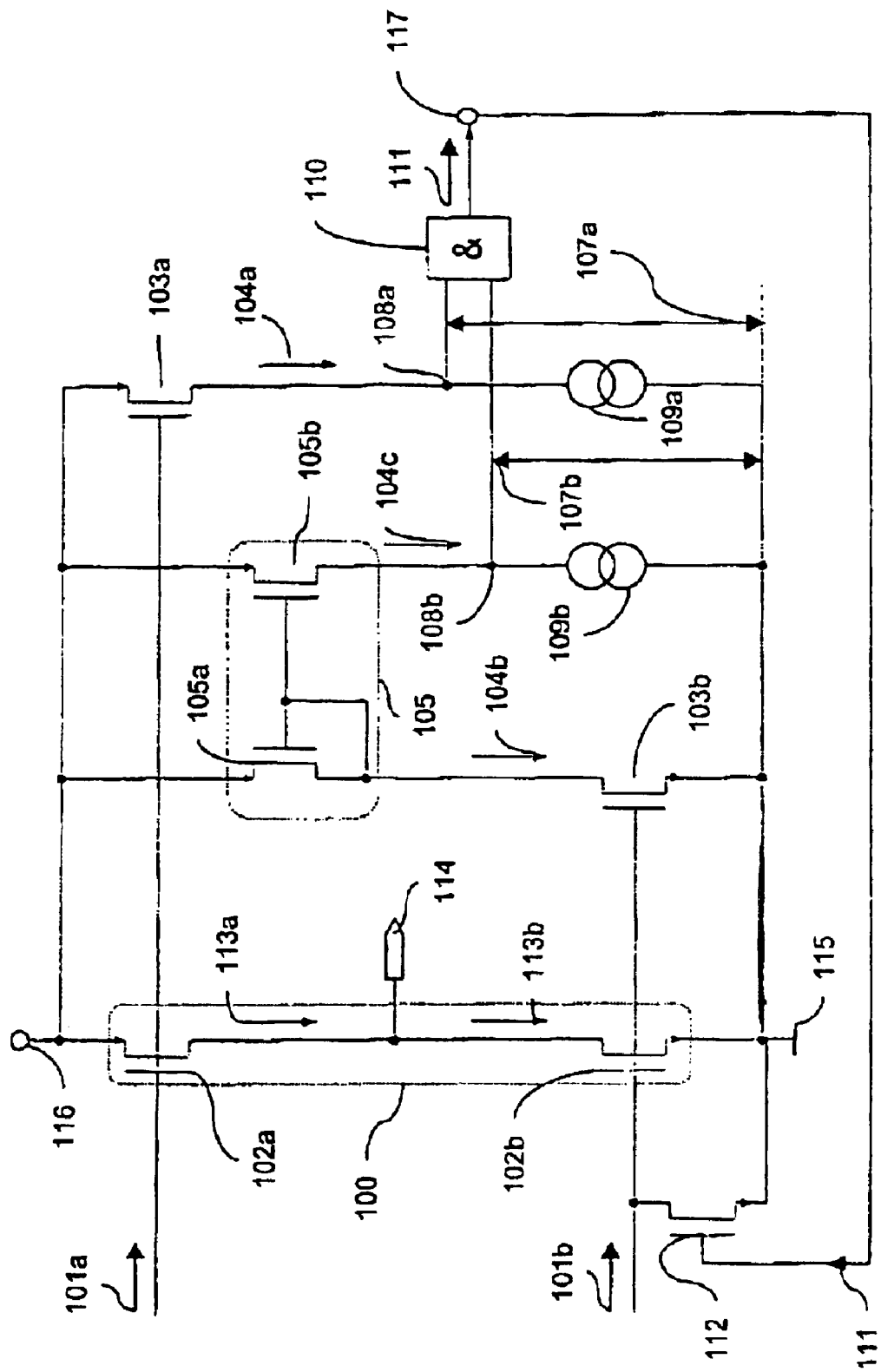

Exemplary embodiments of the invention will be explained in more detail in the following description and are illustrated in the drawings, in which:

FIG. 1 shows a circuit arrangement relating to the amplification of analog push-pull signals by means of a push-pull amplifier output stage, with any inrush current being limited, according to one exemplary embodiment of the present invention; and FIG. 2 shows an outline circuit diagram of a conventional circuit arrangement for amplification of analog push-pull signals.

Identical reference symbols denote identical or functionally identical components or steps in the figures.

Exemplary Embodiment

In the circuit arrangement as illustrated in FIG. 1 according to one exemplary embodiment of the present invention, a push-pull amplifier output stage 100 is supplied with a first analog push-pull signal 101a and with a second analog push-pull signal 101b, with the gate connections of a first output stage transistor 102a and of a second output stage transistor 102b, the two which together form the push-pull amplifier output stage 100, having first and second respective analog push-pull signals applied to them.

During normal operation, only one of the two output stage transistors 102a or 102b is switched on, alternately, so that either a first output current 113a is supplied to a load which is connected to an output connection 114, or a second output current 113b is drawn from the load (not shown) which is connected to the output connection 114. The first output stage transistor 102a is in the form of a p-channel MOS field-effect transistor, while the second output stage transistor 102b is in the form of an n-channel MOS field-effect transistor.

The source connection of the first output stage transistor 102a is connected to a supply voltage 116, while the source connection of the second output stage transistor 102b is connected to ground 115.

The two drain connections of the first output stage transistor 102a and of the second output stage transistor 102b are connected to one another and to the output connection 114. In order to prevent the two output stage transistors 102a, 102b from changing to a switched-on state at the same time, for example on switch on, the output currents 113a, 113b are mapped into control currents 104a, 104c, as will be described in more detail further below.

The first analog push-pull signal 101a is also supplied to the gate connection of the first control transistor 103a, while the second analog push-pull signal 101b is supplied to the gate connection of a second control transistor 103b. The source connection of the first control transistor 103a (p-channel field-effect transistor) is connected to the supply voltage, while the source connection of the second control transistor 103b (n-channel field-effect transistor) is connected to ground. The control currents 104a and 104b, respectively, which are produced by the drives for the control transistors 103a and 103b, respectively, have a fixed ratio to the two output currents 113a and 113b, respectively, such that the control currents are negligible in comparison to the output currents, so that any energy consumption resulting from the control currents can be ignored.

In order to make it possible to logically link the two control currents which reflect occurrence of the output currents, one of the two control currents must be mirrored in a current mirror device.

In the exemplary embodiment of the present invention as described here, the second control current 104b is mirrored in a current mirror device 105 which comprises a first current mirror transistor 105a and a second current mirror transistor 105b, in order in this way to produce a mirrored second control current 104c. The first control current 104a is then compared with a first reference current, which is produced by a first reference current device 109a, such that a first reference voltage level 107a changes from a low level (L level) to a high level (H level) when the first control current 104a is greater than the first reference current.

In the same way, the mirrored second control current 104c is compared in a second reference current device 109b with a second reference current. If the mirrored second control current 104c is greater than the second reference current, then a second reference voltage level 107b changes from a low level to a high level.

The first reference voltage level 107a is tapped off at a first reference voltage connection 108a, and is supplied to a first input connection of a logic circuit unit 110 (in this exemplary embodiment of the invention, the logic circuit unit 110 is in the form of an AND gate, but it is not restricted to this), while the second reference voltage level 107b is supplied from a second reference voltage connection 108b to a second input connection of the AND gate 110. The AND gate 110 is used to logically link the first reference voltage level 107a and the second reference voltage level 107b.

The following text describes the production of a fault signal 111. The linking of the two reference voltage levels 107a, 107b in the AND gate 110 results in a high level (logical H level) when both the first reference voltage level 107a and the second reference voltage level 107b are at an H level. This corresponds precisely to the fault situation in which an excessively high inrush current is flowing, when both output stage transistors 102a and 102b are in a switched-on state, since the two control currents 104a, 104c exactly reflect the ratios of the output currents 113a, 113b. If, on the other hand, only one of the two reference voltage levels 107a, 107b is at an H level, or if both are at an L level, then the output stage is not overloaded by any excessively high inrush current, so that the fault signal 111 is a logic L level. In the fault situation where the fault signal 111 is a logic H level, a fault condition is provided via a fault signal output connection 117.

This fault condition can be used for diagnosis and test purposes, in which case, according to the circuit arrangement of the exemplary embodiment of the present invention, the fault signal 111 is fed back in order to actively prevent a fault situation. The fault signal 111 is supplied to the gate connection of the limiter transistor 112, whose drain connection is connected to the gate connection of the first output stage transistor 102a, and whose source connection is connected to ground.

When a fault signal occurs, the limiter transistor 112 is switched on, and a control voltage for the second output stage transistor 102b is reduced or is connected to ground potential. This means that only one of the two output stage transistors, in this case the first output stage transistor 102a, is in a switched-on state, thus limiting any inrush current.

In the circuit arrangement according to the invention for amplification of analog push-pull signals 101a, 101b by means of a push-pull amplifier output stage 100, the first and second output stage transistors 102a, 102b as well as the first and second control transistors 103a, 103b may be in the form of field-effect transistors (FET) or bipolar transistors.

The current mirror device is formed from at least one first current mirror transistor 105a and at least one second current mirror transistor 105b.

Furthermore, the first current mirror transistor 105a and the second current mirror transistor 105b in the current mirror device 105 are in the form of field-effect transistors (FET) or bipolar transistors.

The first and second reference current devices 109a, 109b are likewise in the form of field-effect transistors (FET) or bipolar transistors.

It should be mentioned that the fault signal 111 may be used in the same manner to limit the control voltage of the first output stage transistor 102a, thus resulting in a defined state in which only the second output stage transistor 102b can be switched to a conductive or switched-on state. The method according to the invention and the circuit arrangement according to the invention thus make it possible to produce a fault signal when a chosen maximum current is exceeded in one or both of the output stage transistors, thus providing a low inrush current threshold.

Furthermore, the circuit arrangement according to the invention allows use with low supply voltages and high output currents. It should be mentioned that the first and second output stage transistors 102a, 102b may be in the form of field-effect transistors (FET) or bipolar transistors. Furthermore, the two reference current devices 109a, 109b may be in the form of field-effect transistors (FET).

With regard to the conventional circuit arrangement as illustrated in FIG. 2, reference should be made to the introduction to the description.

Although the present invention has been described above on the basis of preferred exemplary embodiments, it is not restricted to them, but can be modified in many ways.

List of Reference Symbols

Identical reference symbols denote identical or functionally identical components or steps in the figures.

100 Push-pull amplifier output stage
101a First analog push-pull signal
101b Second analog push-pull signal
102a First output stage transistor
102b Second output stage transistor
103a First control transistor
103b Second control transistor
104a First control current
104b Second control current
104c Mirrored second control current
105 Current mirror device
105a First current mirror transistor
105b Second current mirror transistor
107a First reference voltage level
107b Second reference voltage level
108a First reference voltage connection
108b Second reference voltage connection
109a First reference current device
109b Second reference current device
110 Logic circuit unit
111 Fault signal
112 Limiter transistor
113a First output current
113b Second output current
114 Output connection
115 Ground
116 Supply voltage
117 Fault signal output connection

What is claimed is:

1. A method for amplification of analog push-pull signals by means of a push-pull amplifier output stage having a first output stage transistor and a second output stage transistor, comprising the steps of:
   a) applying a first analog push-pull signal to the first output stage transistor and to a first control transistor by means of which a first control current is controlled;
   b) applying a second analog push-pull signal to the second output stage transistor and to a second control transistor by means of which a second control current is controlled;
   c) comparing the first control current with a first reference current produced by a first reference current device;
   d) comparing the second control current with a second reference current produced by a second reference current device;
   e) outputting a fault signal as a function of the comparison, only when the first reference current is exceeded by the first control current and the second reference current is exceeded by the second control current;
   f) feeding back the fault signal such that an inrush current is limited by limiting at least one control voltage of at least one output stage transistor; and
   g) outputting of the amplified analog push-pull signal as output currents via an output connection.

2. The method of claim 1, further comprising the step of inputting the first analog push-pull signal in complementary form to the second analog push-pull signal.

3. The method of claim 1, further comprising the step of mirroring the second control current with a current mirror device to generate a mirrored second control current.

4. The method of claim 1, further comprising the step of providing the fault signal for diagnosis and test purposes via a fault output connection and wherein the fault signal is output from an output connection of a logic circuit unit.

5. The method of claim 3 wherein the ratio of the first control current to the mirrored second control current is selected such that it corresponds to the ratio of the first output current to the second output current.

6. The method of claim 5, wherein the ratio of the first control current to the first output current, and the ratio of the mirrored second control current to the second output current are selected such that the energy consumption for provision of the fault signal is negligible.

7. The method of claim 1, wherein that the fault signal is supplied to the gate connection of a limiter transistor used to limit a control voltage for the second output stage transistor.

8. The method of claim 4, further comprising the steps of outputting the fault signal from a fault signal output connection of the logic circuit unit and supplying the fault signal to an external processor in which the fault signal is processed further.

9. The method of claim 1, further comprising the step of preventing a parallel current via the push-pull amplifier output stage during switching.

10. The method of claim 8, wherein the logic circuit unit is combined with analog circuit technology.

11. The method of claim 10, wherein that a logic link is provided in the logic circuit unit by means of at least one of a logic gate and one logic function.

12. The method of claim 1, wherein a first reference voltage level at a first reference voltage connection changes from a low level (logic L level) to a high level (logic H level) when the first control current is greater than the first reference current.

13. The method of claim 12, wherein a second reference voltage level at a second reference voltage connection chances from a low level (logic L level) to a high level (logic H level) when the second control current is greater than the second reference current.

14. The method of claim 13, wherein the first reference voltage level and the second reference voltage level are linked in a logic circuit unit in order to produce a fault signal.

15. The method of claim 14, wherein the logic circuit unit emits a fault signal when both the first reference voltage level and the second reference voltage level are at a high level (logic H level) at the same time.

16. The method of claim 1, wherein a gate connection of a limiter transistor has the fault signal applied to it, in order to limit the inrush current through at least one output stage transistor.

17. The method of claim 16, and further comprising the step of feeding back the fault signal to electronic circuits of input stage devices such that any inrush current is limited in that at least one control voltage of at least one output stage transistor is limited.

18. A circuit for amplification of analog push-pull signals by means of a push-pull amplifier output stage comprising:
   a first output stage transistor;
   a second output stage transistor;
   a first control transistor which is used to control a first control current;
   a second control transistor which is used to control a second control current;
   a first reference current device for producing a first reference current which is compared with the first control current;
   a second reference current device for producing a second reference current which is compared with the second control current;

a limiter device for driving at least one of the first and second output stage transistors such that any inrush current is limited as a function of a comparison of the control current with the respective reference currents when the first reference current is exceeded by the first control current and the second reference current is also exceeded by the second control current; and an output connection for outputting amplified analog push-pull signals as output currents as a function limited by the limiter device.

19. The circuit of claim 18, wherein the first and second output stage transistors and the first and second control transistors are field-effect transistors (FET).

20. The circuit of claim 18, further comprising a current mirror device for mirroring the second control current into a mirrored second control current.

21. The circuit of claim 20, wherein the current mirror device comprises a first current mirror transistor and a second current mirror transistor.

22. The circuit of claim 21, wherein the first current mirror transistor and the second current mirror transistor are field-effect transistors (FET).

23. The circuit of claim 18, wherein the circuit is formed by a combination of analog and logic or digital circuit units.

24. The circuit of claim 19, wherein the first output stage transistor is in the form of a p channel field-effect transistor (pMOS).

25. The circuit of claim 24, wherein the second output stage transistor is in the form of an n-channel field-effect transistor (nMOS).

26. The circuit of claim 18, wherein the first and second reference current devices are field-effect transistors (FET).

27. The circuit of claim 18, further comprising a logic circuit unit for logic linking of a first reference voltage level and of a second reference voltage level.

28. The circuit of claim 27, wherein the logic circuit unit provides a fault signal and is in the form of an AND gate.

29. The circuit of claim 28, wherein the limiter device limits the inrush current as a function of the fault signal.

30. The circuit of claim 18, wherein the limiter device is provided as a limiter transistor.

* * * * *